United States Patent [19]
Takagi et al.

[11] Patent Number: 5,631,809
[45] Date of Patent: May 20, 1997

[54] SEMICONDUCTOR DEVICE FOR ULTRAHIGH FREQUENCY BAND AND SEMICONDUCTOR APPARATUS INCLUDING THE SEMICONDUCTOR DEVICE

[75] Inventors: Eiji Takagi, Yokosuka; Yuji Iseki, Yokohama; Naoko Ono, Tokyo, all of Japan

[73] Assignee: Kabushiki Kaisha Toshiba, Kawasaki, Japan

[21] Appl. No.: 305,397

[22] Filed: Sep. 13, 1994

[30] Foreign Application Priority Data

Sep. 17, 1993 [JP] Japan .................................. 5-231674

[51] Int. Cl.⁶ ........................ H05K 9/00; H05K 7/02; H01L 23/043; H01L 23/552
[52] U.S. Cl. ........................ 361/820; 174/35 R; 174/51; 174/52.4; 257/728; 257/659; 257/692; 257/693; 257/696; 333/247; 361/772; 361/783; 361/816; 361/818
[58] Field of Search .................. 174/51, 52.1, 52.2, 174/52.3, 52.4, 35 R, 35 TS; 333/33, 246, 247; 257/659, 664, 691, 728, 735, 730, 696; 361/813, 816, 818, 820, 212, 220; 439/68, 83

[56] References Cited

U.S. PATENT DOCUMENTS

| | | | |
|---|---|---|---|
| 5,057,805 | 10/1991 | Kadowaki | 333/247 |
| 5,075,759 | 12/1991 | Moline | 257/728 |
| 5,294,897 | 3/1994 | Notani et al. | 333/246 |

FOREIGN PATENT DOCUMENTS

| | | | |
|---|---|---|---|
| 62-134945 | 6/1987 | Japan | 257/730 |
| 62-263667 | 11/1987 | Japan | 257/696 |
| 63-188961 | 8/1988 | Japan | 257/728 |
| 6-140528 | 5/1994 | Japan | 257/728 |
| 6-168988 | 6/1994 | Japan . | |

OTHER PUBLICATIONS

"Maxim Integrated Circuits Data Handbook", 1989, p. A-12.
Claude L. Bertin, et al., "Evaluation of a Three–Dimensional Memory Cube System", IEEE Trans. on CHMT, vol. 16, No. 8, pp. 1006–1011, 1993.

Primary Examiner—Donald Sparks
Attorney, Agent, or Firm—Oblon, Spivak, McClelland, Maier & Neustadt, P.C.

[57] ABSTRACT

A semiconductor device comprising a semiconductor chip, a sheet-like metal member electrically connected to a major surface of the semiconductor chip and serving as a ground electrode for the chip, and input/output electrodes electrically connected to the semiconductor chip and situated in the same plane as that of the sheet-like metal member, the chip, the metal member, and the input/output electrodes being encapsulated in an electrically insulating member having a bottom surface and adapted to be mounted on a surface of a circuit board. The sheet-like metal member is brought out from inside the electrically insulating member without being bent and has its one end face situated in substantially the same plane as the bottom surface of the electrically insulating member which faces to the surface of the circuit board when the metal member is mounted on the circuit board and the major surface of the chip is approximately prependicular to the end face of the sheet-like metal member.

10 Claims, 10 Drawing Sheets

SEMICONDUCTOR DEVICE FOR ULTRAHIGH FREQUENCY BAND AND SEMICONDUCTOR APPARATUS INCLUDING THE SEMICONDUCTOR DEVICE

BACKGROUND OF THE INVENTION

1. Field of the Invention

The present invention relates to a semiconductor device used in an ultrahigh frequency band and semiconductor apparatus using the semiconductor device or devices.

2. Description of the Related Art

A semiconductor chip, such as a small signal amplifying chip, is manufactured as a semiconductor device encapsulated with various materials and, primarily, a mold resin type and ceramics type are used as such a package.

Figure 1:
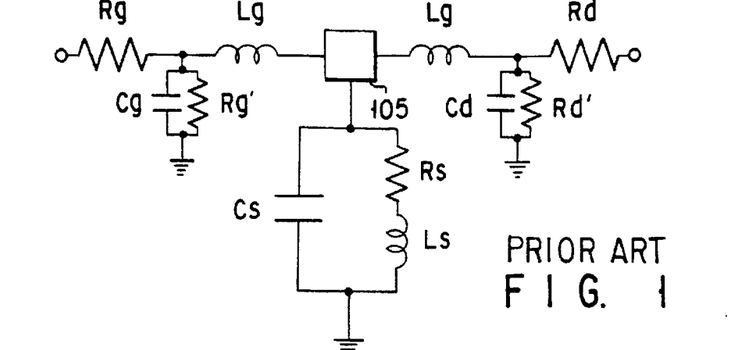
FIG. 1 is a circuit diagram showing an electrical circuit of a semiconductor device.

The semiconductor device using a small signal amplifying chip demands a low noise characteristic and high gain characteristic and the electrical characteristic of the semiconductor device can be normally represented by an equivalent circuit as shown in FIG. 1. In FIG. 1, a semiconductor chip is indicated by reference numeral 105 and the circuit contains various high-frequency-like parasitic parameters, causing increased noise and lowered gain.

In a semiconductor device including a small signal amplifying chip, a matching circuit is juxtaposed near the device normally mounted on a board in order to minimize the noise figure or maximize the gain. Therefore, decreasing, among the aforementioned parasitic parameter components, a parasitic parameter component not compensated for by the matching circuit is important to derive out the characteristics from the semiconductor device. The parasitic parameters not compensated for by the matching circuit is comprised of, in a practical embodiment, a pure resistance and an inductance component in series with the ground of the semiconductor chip. In particular, the loss component at an input section exerts a direct influence over the noise figure of the mounted semiconductor chip and an inductance connected in series with a ground electrode acts as a negative feedback, thus leading to a lowered gain.

Figure 2:
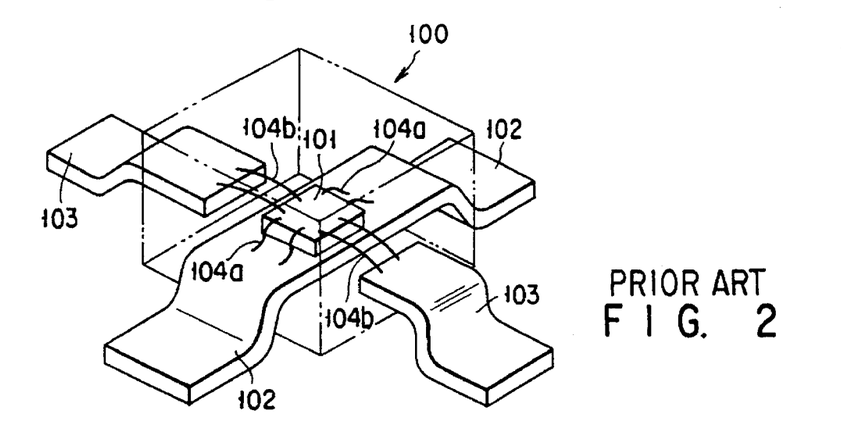
FIG. 2 is a perspective view showing a mold-type package according to a conventional semiconductor device.

A conventional mold type package is shown in FIG. 2 by way of example. In a semiconductor device 100, a semiconductor chip 101 is connected by bonding wires 104a to a ground electrode 102. The portions of ground electrode 102, being brought out from the two opposed sides of the semiconductor device 100, is bent flush with the bottom surface of the device so that the ground electrode may be mounted on a circuit board. Those opposed electrodes 103,103 are provided in a 90°-intersecting relation to the ground electrode 102 so that they serve as an input/output electrodes. The electrodes 103 are connected by bonding wires 104b to the semiconductor chip 101. The portions of the electrodes 103, being brought out from the remaining opposed sides of the device 100, are bent as in the case of the ground electrode 102, that is, bent flush with the bottom surface of the device.

Aforementioned loss can be divided into dielectric loss and metal loss.

A resin used for the semiconductor device has a dielectric loss tangent about 10 times as great as that of alumina and the dielectric loss of the mold resin type becomes greater than the ceramics type. For the mold resin type package, the input section is formed of a metal piece (lead frame) and the metal loss is small compared with the ceramics type package. Taken this into consideration, the total loss of the input section little varies between the ceramics type and the mold resin type. For a package of an outer configuration of 1.78 mm square generally in use, for example, the loss is about 0.05 dB. In a currently developed highest-level low-noise amplifier type, the noise figure is about 0.5 dB and an influence of package loss upon the characteristic of the whole semiconductor device is a little less than 10%. However, the gain is greatly influenced from the inductance grounded.

Figure 3:
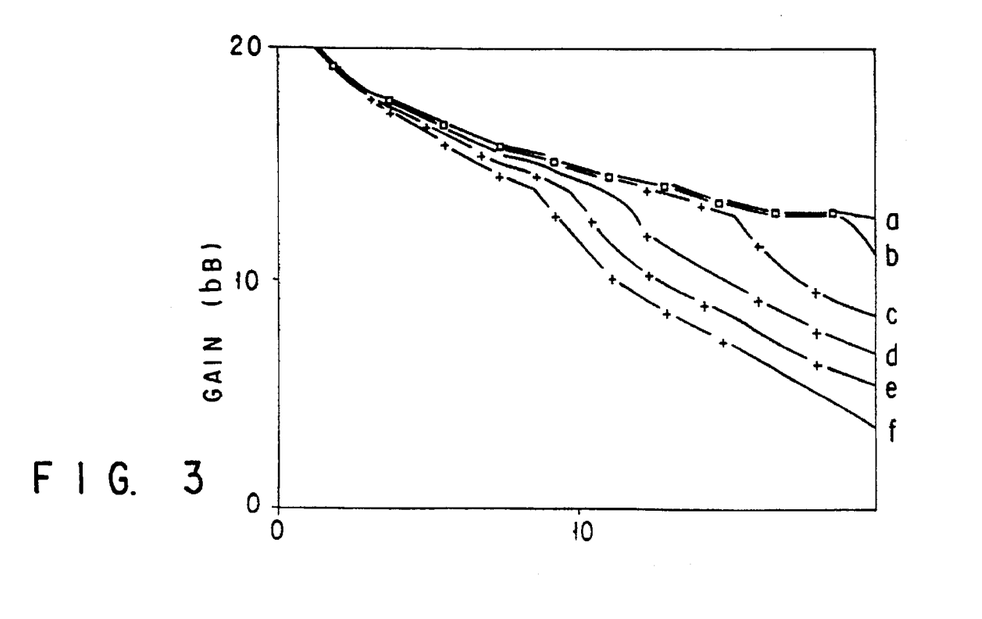
FIG. 3 is a graph showing a relation between those frequencies at various inductance levels and a gain.

FIG. 3 shows the result of calculation made on the characteristic of a gain while varying the value of the inductance grounded Ls in the circuit shown in FIG. 1. In the graph shown in FIG. 3, the curves b, c, d, e and f correspond to the inductance values being 0.01, 0.05, 0.09, 0.13 and 0.17 nH, respectively, and the curve a denotes the characteristic of a semiconductor chip itself (bare chip) used for the calculation. For the mold type package of FIG. 2 mounted on the board, the ground inductance was 0.17 nH upon evaluation on the characteristic of the equivalent circuit. This corresponds to the curve f in FIG. 3. Upon comparison between this characteristic and the characteristic (curve a) of the chip itself shown in FIG. 3 it is found that, for 12 GHz for instance, the gain was decreased by as low as 5 dB.

It is to be noted that such a mold type package is usually molded by a transfer molding method. A lead frame (electrode) used in this method is chiefly formed by etching technique or press working and the shape of the lead frame is restricted to some extent. The shape of the lead frame is also restricted in the cases where, in order to readily effect a wire bonding, the lead frame is thinly formed and terminal electrodes (pads) are located in the same plane.

A leadless chip carrier (LCC) and quad flat package (QFP) are known as the examples of the ceramics type package. In the case of LCC, the inner leads for signals are electrically connected to a connection electrode on the lower surface of the package by a metallized pattern provided at the side surfaces of the package. Since, in this way, the signal leads are provided by metallization from the side surfaces to the rear surface of the package, the lower surface of the package cannot be constructed by a metal piece. In the case of LCC, there is some limitation to reducing the inductance grounded.

On the other hand, QFP has generally been employed as a surface-mounting type package for high-frequency chip because a parasitic parameter in the connection section is small compared with through hole mount device such as PGA (pin grid array) or DIP (dual in-line package). In the case of QFP, the signal leads brought out from inside the package are electrically connected to the printed circuit board by the lead frame brazed to the package.

In the device for such high-frequency chip, however, a greater influence is exerted, on many occasions, over the characteristics of the device. In order to reduce the inductance, the lower surface of the device, together with the lead frame, is contacted with the circuit board to achieve a connection to an external ground electrode in which case, in order to also improve a heat dissipation characteristic, the lower surface of the device is composed of a piece made of an alloy, such as a copper-tungsten alloy. In the case of QFP, the inductance grounded can be made smaller, but a greater mounting area is required for the lead frame. The device involves its characteristic degradation resulting from a fall in its own resonance frequency. The unit cost is also raised.

In the semiconductor device comprised of a package encapsulated with a resin, etc., having a small signal amplifying chip mounted on the ground electrode, the gain is largely lowered compared with that of a bare chip, thus presenting a problem.

As a device with leads brought out from a surface facing to a surface of a circuit board, a device of a TO-type or the like is conventionally known in MAXIM 1989 Integrated Circuits Data Book. Since the device has relatively long leads, a greater inductance is involved and, further, the leads are mounted on the circuit board by insertion, thus presenting a problem from the standpoint of manufacturing steps. Since the device is used over a low frequency of a range of several ten MHz, it is not fitted to the application to an ultrahigh frequency of about 1 to several ten GHz.

SUMMARY OF THE INVENTION

An object of the present invention is to provide a semiconductor device which can suppress a lowering of a gain after a chip has been mounted, can ensure high reliability, can suppress a decrease in the device-mountable area of a circuit board and can be used over an ultrahigh frequency band.

Another object of the present invention is to provide a semiconductor apparatus which can mount semiconductor devices on a circuit board at a high mounting density, the semiconductor device being capable of suppressing a lowering of a gain after a chip has been mounted, ensuring high reliability and being used over an ultrahigh frequency.

According to one aspect of the present invention, there is provided a semiconductor device comprising a semiconductor chip, a sheet-like metal member electrically connected to a major surface of the semiconductor chip and serving as a ground electrode (lead) for the chip, and input/output electrodes (signal leads) electrically connected to the semiconductor chip and situated in the same plane as that of the sheet-like metal member, said chip, metal member, and input/output electrodes being encapsulated in an electrically insulating member and adapted to be mounted on a surface of a circuit board, wherein the sheet-like metal member is brought out from inside the electrically insulating member without being bent and has its one end face situated in substantially the same plane as a bottom surface of the electrically insulating member which faces to the surface of the circuit board when the device is mounted on the circuit board and the major surface of the chip is approximately perpendicular to the end face of the sheet-like metal member.

According to another aspect of the present invention, there is provided a semiconductor apparatus comprising
  a semiconductor device including a semiconductor chip, a sheet-like metal member electrically connected to the semiconductor chip and serving as a ground electrode (lead) for the chip, and input/output electrodes (signal leads) electrically connected to a major surface of the semiconductor chip and situated in the same plane as that of the sheet-like metal member, said chip, metal member, and input/output electrodes being encapsulated in an electrically insulating member, and
  a circuit board for mounting the semiconductor device thereon,
  wherein the sheet-like metal member in the semiconductor device is brought out from inside the electrically insulating member without being bent and has its one end face situated in substantially the same plane as one face of the electrically insulating member and that surface of the electrically insulating member including the end face of the metal member is so mounted as to face to the surface of the circuit board and the major surface of the chip is approximately perpendicular to the face of the circuit board.

According to another aspect of the present invention, there is provided a semiconductor device comprising a semiconductor chip, a sheet-like metal member electrically connected to a major surface of the semiconductor chip and serving as a ground electrode (lead) for the chip, and input/output electrodes (signal leads) electrically connected to the semiconductor chip and situated in the same plane as that of the sheet-like metal member, said chip, metal member, and input/output electrodes being encapsulated in an electrically insulating member and adapted to be mounted on a surface of a circuit board, wherein the sheet-like metal member is brought out from inside the electrically insulating member without being bent and has its one end face projected 1 mm or less from that bottom surface of the electrically insulating member facing to the surface of the circuit board when the electrically insulating member is attached to the surface of the circuit board and the major surface of the chip is approximately perpendicular to the end face of the sheet-like metal member.

According to further aspect of the present invention, there is provided a semiconductor apparatus comprising a semiconductor device including a semiconductor chip, a sheet-like metal member electrically connected to a major surface of the semiconductor chip and serving as a ground electrode (lead) for the chip, and input/output electrodes (signal leads) electrically connected to the semiconductor chip and situated in the same plane as that of the sheet-like metal member, said chip, metal member, and input/output electrodes being encapsulated in an electrically insulating member and a circuit board for mounting the semiconductor device thereon, wherein the sheet-like metal member is brought out from inside the electrically insulating member without being bent and has its one end face projected 1 mm or less from one surface of the electrically insulating member facing to the surface of the circuit board and the electrically insulating member is attached to the surface of the circuit board and the major surface of the chip is approximately perpendicular to the face of the circuit board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

In the present invention, the semiconductor device represents a package with an electrode (lead), for example, an electrode (lead) with a semiconductor chip mounted thereon, encapsulated in an electrically insulated member and the apparatus represents an assembly with the semiconductor device or devices mounted on a circuit board.

In the semiconductor device of the present invention, a metal member serving as a ground electrode (lead) with a semiconductor chip mounted thereon has its one end face formed in the same plane as that in contact with a circuit board of the device. The electrode is connected directly to an associated electrode of the mounting board without increasing an area required to mount the device on the circuit board. Said end face of the ground electrode (lead) is approximately perpendicular to the major surface of the chip mounted thereon. Thus, in the semiconductor apparatus of the invention, the major surface of the chip is situated approximately perpendicular to an actual mounting surface of the circuit board.

In the semiconductor device of the present invention in particular, it is not necessary to, upon the device being mounted on the circuit board, bend the ground electrode's opposed end portions after being brought out from the semiconductor device, as in the prior art, so that the bent opposed end portions are made at the same height as a plane in which the bottom surface of the device is situated. It is, therefore, possible to prevent a rise in the inductance of the electrode section and hence to reduce the degradation of the device's characteristic by packaging.

For either the mold type or the ceramics type, the electrode is integrated with a surrounding structure, thus preventing any decrease in its intimate bond. Therefore, the end face of the ground electrode (lead), even being situated on the surface of the semiconductor device, can secure the device's reliability.

The embodiments of the present invention will be explained below in more detail with reference to the accompanying drawings.

First, the semiconductor device of the present invention will be explained below by explaining, by way of example, a mold type semiconductor device with a chip and electrodes (lead) encapsulated with a resin. As a resin, for example, use can be epoxy resin. According to the present invention, the mold type semiconductor device can be manufactured such that an electrode (lead) with a chip electrically connected thereto is encapsulated with a resin with the use of a transfer mold method.

Figure 4:
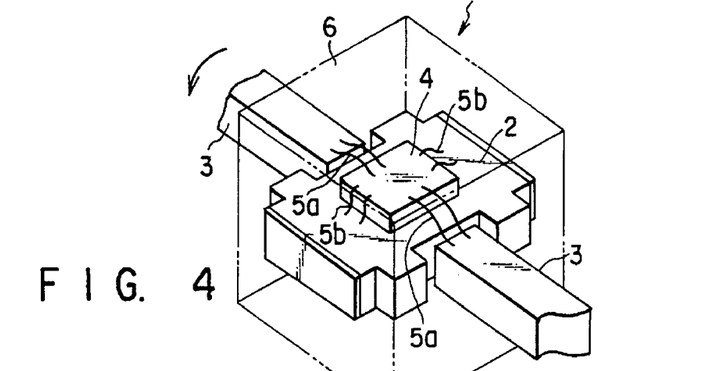
FIG. 4 is a perspective view showing a semiconductor device according to one embodiment of the present invention.
Figures 5, 6:
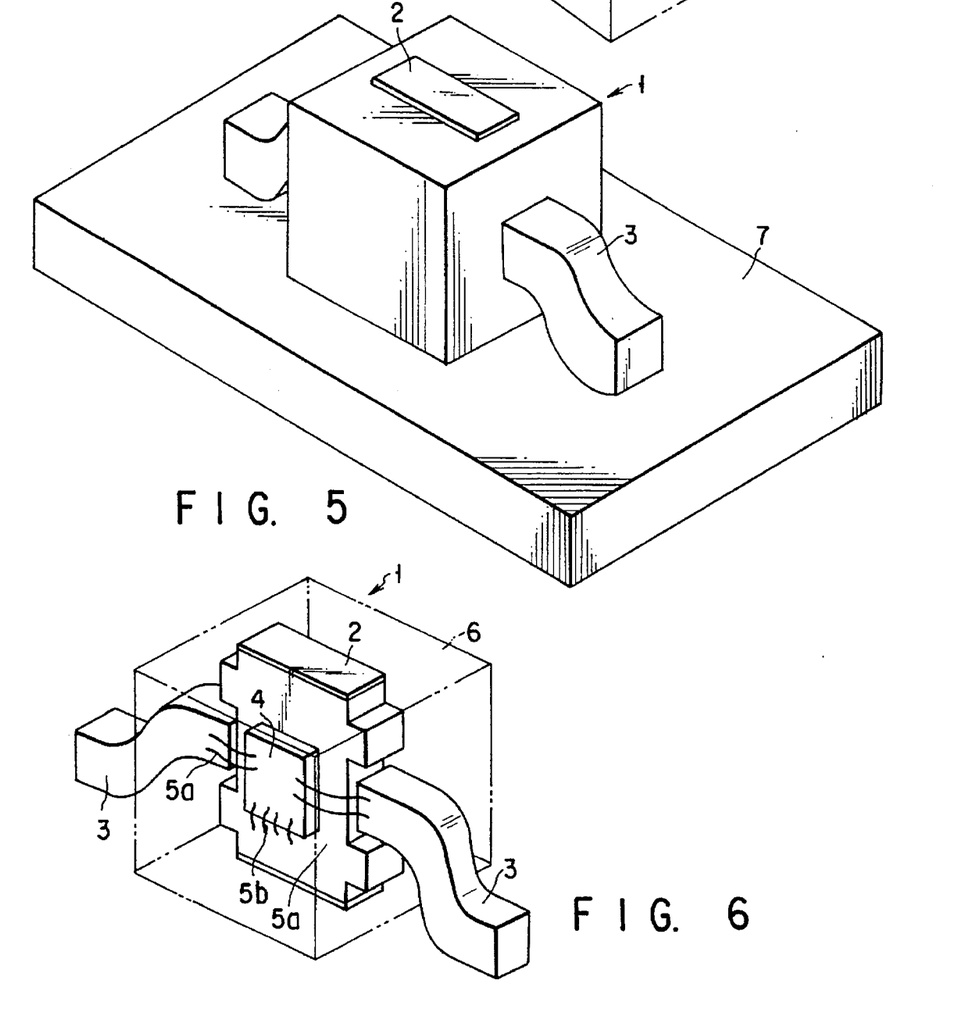
FIG. 5 is a perspective view showing a semiconductor apparatus according to another embodiment of the present invention.
FIG. 6 is a perspective view showing a semiconductor device according to another embodiment of the present invention.

FIG. 4 is a perspective view showing a mold type semiconductor device according to one embodiment of the present invention. FIG. 5 is a perspective view showing a semiconductor apparatus with the semiconductor device mounted on the circuit board.

As shown in FIG. 4, the semiconductor device 1 is comprised of a package encapsulated with a resin 6, that is, a package including a metal member 2 with a semiconductor chip 4 joined thereto by a resin-based adhesive or soldering and input/output electrodes (signal leads) 3. The metal member 2 serves as a ground electrode (lead). The ground electrode (lead) is electrically connected by bonding wires 5b to a ground electrode, not shown, of the semiconductor chip 4. The portions of the ground electrode (lead) 2 is brought out from inside an electrically insulated member of a resin 6 without being bent. The ground electrode (lead) 2 has its opposed end faces situated in the same planes as the opposed surfaces, respectively, of the semiconductor device. The input/output electrodes (signal leads) 3 are connected by bonding wires 5a to the corresponding electrodes of the semiconductor chip. The electrodes (signal leads) 3 are each connected to an outside of the semiconductor device 1 to take out a signal.

The semiconductor device 1 is mounted on the circuit board by 90° rotating it around the input/output electrodes (signal leads) 3 in a direction indicated by an arrow in FIG. 4 to obtain a semiconductor apparatus as shown in FIG. 5.

Stated in another way, the semiconductor apparatus of the present invention is of such a type that one of those opposed surfaces of the semiconductor device which include the end faces, respectively, of the ground electrode (lead) 2 is mounted on the surface of the circuit board in an opposed relation. By so doing, the ground electrode (lead) 2 is electrically connected directly to the associated electrode (not shown) of the circuit board 7. The input/output electrodes (signal lead) 3, after having its opposed end portions bent relative to the surface of the circuit board, can be connected to the corresponding terminals on the circuit board.

The end face of the electrode (lead) 2 situated remote from the circuit board may be projected from the device surface in a plane parallel to the bottom surface of the semiconductor device 1.

In the present invention, an ordinary printed circuit board can be used as a board for mounting the semiconductor device thereon.

The inductance grounded obtained with the semiconductor device so mounted on the circuit board was about 0.13 nH. This corresponds to the characteristic as represented by the curve e in FIG. 3. That is, according to the present invention, the end face of the ground electrode (lead) is situated in the same plane as the surface of the device with the portion of the ground electrode (lead) 2 brought out from the device without being bent and from this it has been found that the inductance is reduced by the extent more than 0.4 nH. Further, the gain at 12 GHz is improved by the extent of about 2 dB compared with the conventional semiconductor device (curve f).

Normally, the semiconductor chip 4 is connected by the bonding wires 5b to the ground electrode (lead) 2 as shown in FIG. 4. The semiconductor device of the present invention is mounted on the circuit board as shown in FIG. 5 and the connection made near the board dominantly determines the inductance grounded. By varying the number of bonding wires for connecting together the semiconductor chip 4 and ground electrode (lead) on the near and the far side relative to the circuit board, it is possible to reduce that whole inductance grounded. The semiconductor chip 4 may be connected to the ground electrode (lead) 2 only on the near side relative to the circuit board shown, for example in FIG. 6. This specific arrangement can further reduce the inductance grounded level.

In a mold package, the smaller the cross-sectional area of the electrode situated in the surface of the semiconductor device, the better, in order to reduce the semiconductor device in size and improve long-term reliability. The ground electrode (lead), being made compact, leads to an increase in the grounded inductance. It is preferable that, in order to simultaneously secure the high integration density, long-term reliability and low inductance grounded, the ground electrode be made larger by varying the sizes of the ground electrode and other electrodes. A desirable effect can be preferably obtained when, for example, the cross-sectional area of the ground electrode is made 2 or more times those of the input/output electrodes. Further, since the inductance is affected also due to the electrode section encapsulated with the electrically insulating member, the cross-sectional area of the ground electrode is preferably made 2 or more times those of the other electrodes.

Figures 7A, 7B:
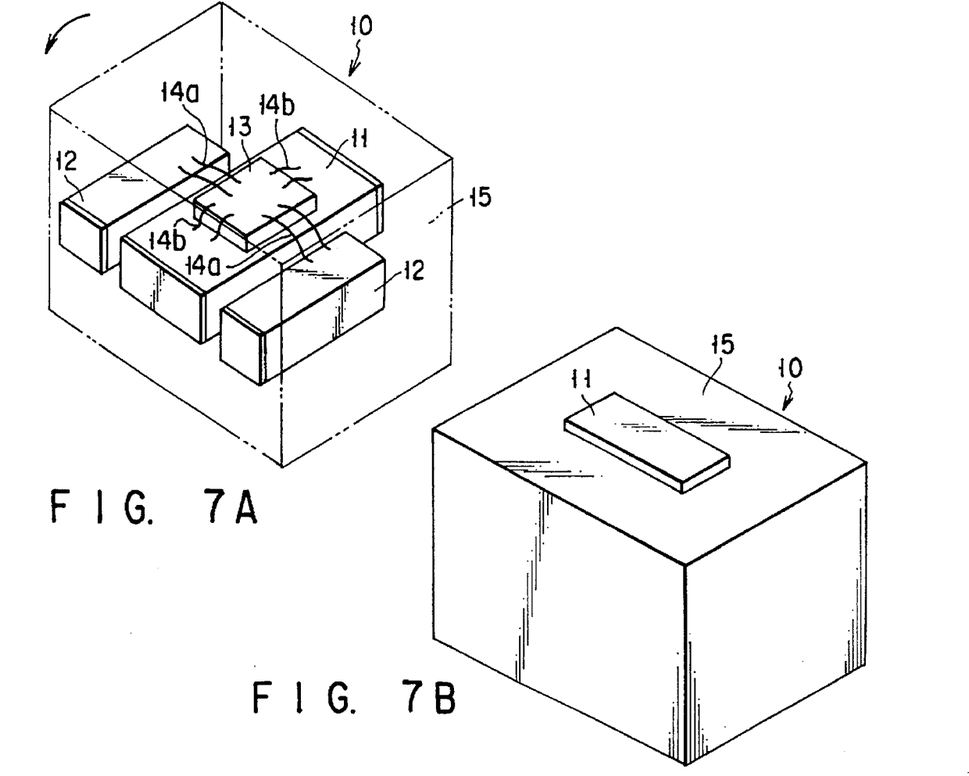
FIG. 7A is a perspective view showing another embodiment of the present invention.
FIG. 7B is a perspective view showing an outer appearance of the semiconductor device of FIG. 7A.

FIGS. 7A and 7B show a semiconductor device according to another embodiment of the present invention, FIG. 7A being a perspective view and FIG. 7B being also a perspective view showing the semiconductor device (FIG. 7A) in a state 90° rotated in a direction as indicated by an arrow in FIG. 7A. As shown in FIG. 7A, the semiconductor device 10 is comprised of an encapsulated structure having a ground electrode (lead) 11 with a semiconductor chip 13 connected thereto by the bonding wires 14b and input/output electrodes (signal leads) 12 the structure being encapsulated with a resin 15. The electrode (lead) 12 is connected by bonding wires 14a to the semiconductor chip 13. The one-side end faces of these electrodes (leads) 11 and 12 are situated in the same plane as the corresponding surface of the semiconductor device 10.

Figure 8:
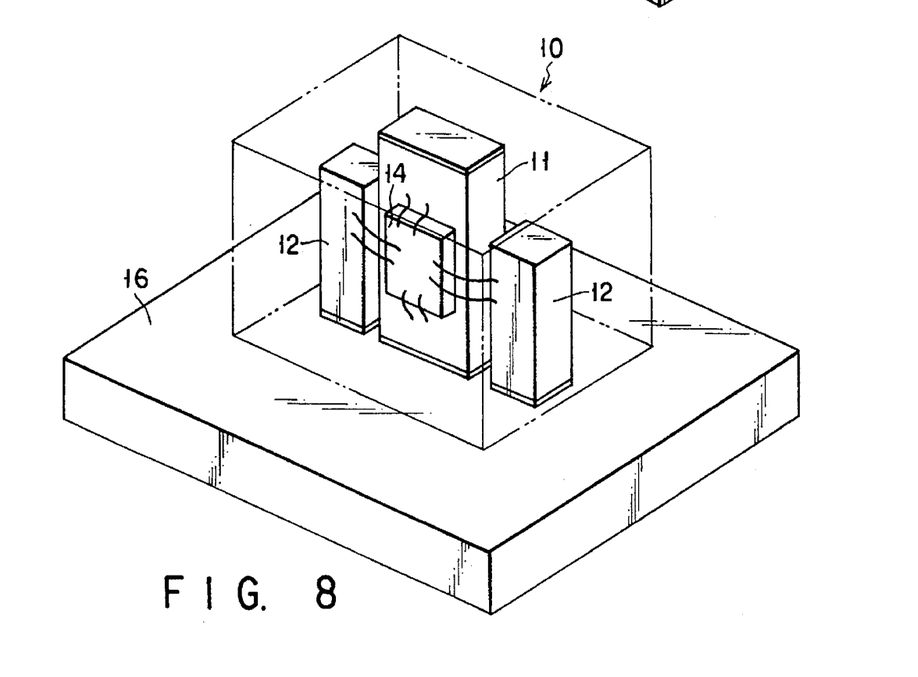
FIG. 8 is a perspective view showing a semiconductor apparatus according to another embodiment of the present invention.

As shown in FIG. 8, the semiconductor device 10 is mounted on a circuit board 16 with the exposed end faces of the electrodes (leads) 11 and 12 facing to the mounting surface of the circuit board 16. In this way it is possible to obtain a semiconductor apparatus.

In the semiconductor device 10, the ground electrode (lead) 11 and input/output electrodes (signal leads) 12 are situated on the inner side of the device and the circuit board area necessary for the device to be mounted thereon is equal to the bottom area of the device, thus enabling the semiconductor device to be provided as a high-integration density unit as compared with the semiconductor device 1 as shown in FIG. 4.

Figure 9:
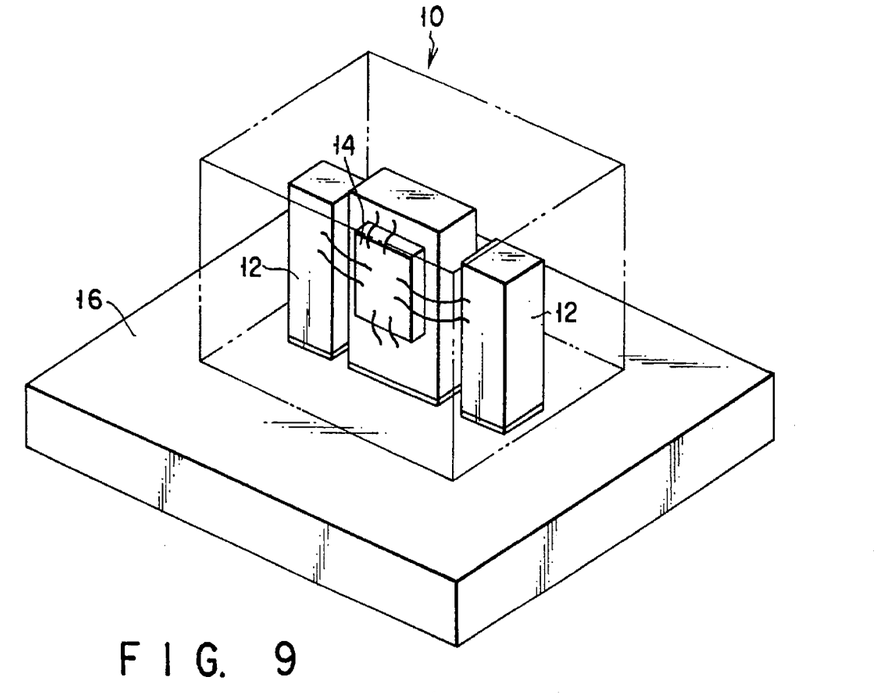
FIG. 9 is a perspective view showing a semiconductor apparatus according to another embodiment of the present invention.
Figure 10:
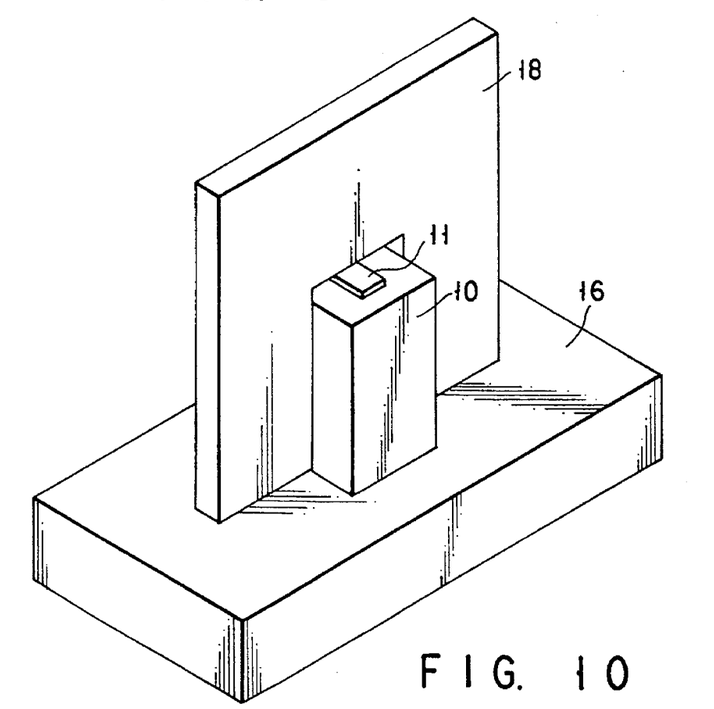
FIG. 10 is a perspective view showing a semiconductor apparatus according to another embodiment of the present invention.

The semiconductor device as shown in FIGS. 7A and 7B allows some variations to be achieved as set out below. As shown in FIG. 9, for example, the semiconductor device 10 may be mounted on the circuit board 16 with the one end face of the ground electrode (lead) 11 situated on the bottom surface of the device 10 and the other end face of the ground electrode (lead) 11 not exposed to the surfaces of the device 10. Further, a shield sheet 18 made of a metal may be provided such that it is positioned over the top surface of the device in a 90°-intersecting relation to a chip mounting surface of a ground electrode (lead) 11 as shown in FIG. 10. The shield sheet divides the outline of the device over an area from above the device down to the surface of the circuit board 16. The shield sheet, being so provided, can reduce noise involved and prevent oscillation. In the case where a small type device is mounted on the circuit board by soldering, a "manhattan phenomenon" occurs, causing the device to be partially floated off the surface due to a difference in a varying surface tension in soldered parts. Such soldering defect can be suppressed by providing the shield plate. It is, therefore, possible to obtain high-assembly-yield semiconductor device. In order to gain such an effect, the shield sheet is so dimensioned as to have at least about 3 mm square.

Figure 11:
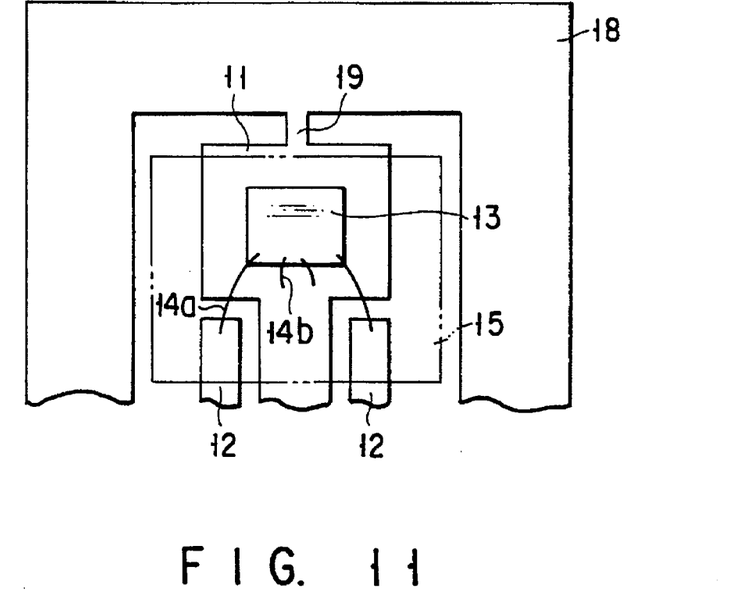
FIG. 11 is a plan view showing a semiconductor device manufactured according to a method of the present invention.

It is to be noted that, after the semiconductor device has been manufactured, the shield sheet can be mounted in a given position. In another form of a variant, it may be mounted as a unit integral with an electrode (lead) for mounting a chip. In this variant, first the shield plate 18 is formed integral with a ground electrode (lead) 11 as shown in FIG. 11. After the chip 13 mounted on the ground electrode (lead) 11 has been connected to the electrodes (leads) 11 and 12 by bonding wires 14b and 14a, respectively, a resultant electrode (lead) structure is encapsulated with a resin 15. Then the shield sheet 18 is 90° rotated around a connection area between the shield sheet 18 and the ground electrode (lead) 11. By so doing, a semiconductor device can be obtained with the shield sheet mounted in a given position. The integral structure of the shield sheet enables an excellent shield effect to be obtained over a separation type. Further, it is also possible to obtain the advantage of reducing the number of component parts required.

Figure 12:
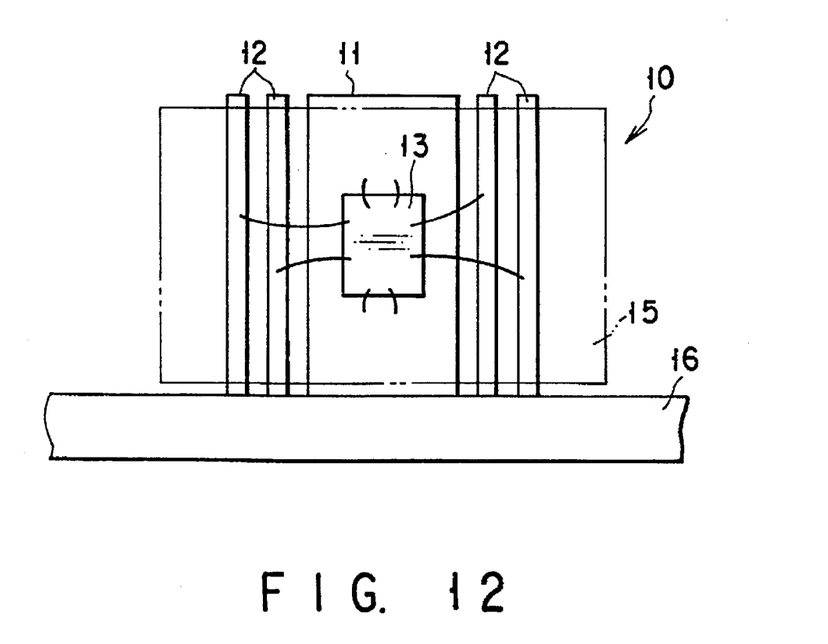
FIG. 12 is a cross-sectional view showing a semiconductor apparatus according to another embodiment of the present invention.

The ground electrode (lead) may be projected from the base surface and top surface of the device. In this case, the length of the projection is preferably below 1 mm, preferably below 0.5 mm. As shown in FIG. 12, for example, an apparatus can be obtained with a device 10 being attached to a board 16 with opposed end portions of the ground electrode (lead) projected upwardly and downwardly.

Figure 13A:
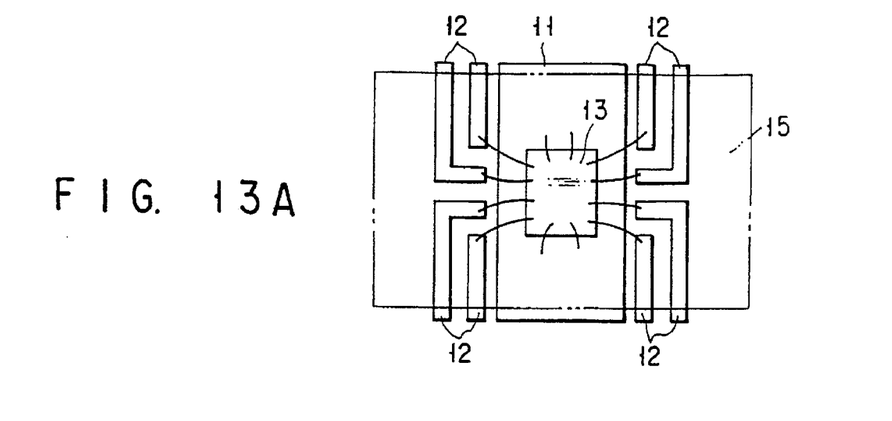
FIG. 13A is a cross-sectional view showing a semiconductor device according to another embodiment of the present invention.
Figure 13B:
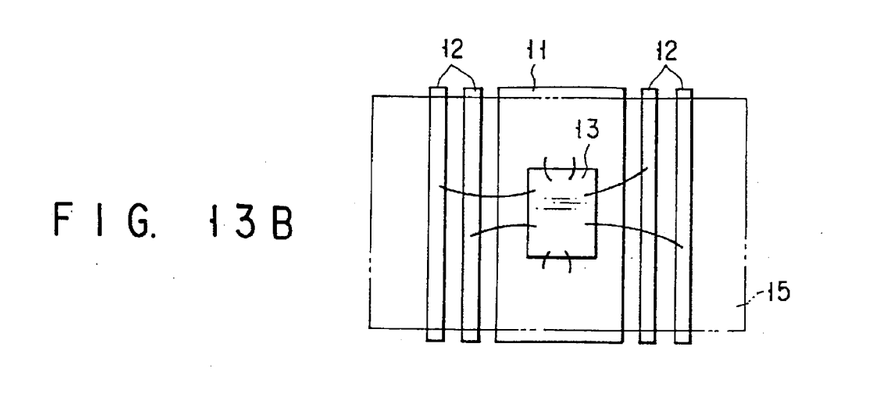
FIG. 13B a view showing another embodiment and FIG. 13C a view showing another embodiment.

Those input/output electrodes (signal leads) 12 can be brought out from the bottom surface of the device as well as from any surfaces of the device. The electrodes (leads) 12 can be brought out in those up/down directions or those up/down and right/left directions, for example, in FIGS. 13A, 13B and 13C. With the electrodes (leads) 12 thus brought out, a plurality of semiconductor devices are directly connected together in those proper directions as shown in FIG. 14. As a result, a parasitic parameter is decreased in their connection areas, thus leading to an improved high-frequency characteristic and to a reduced mounting area.

Figure 13C:
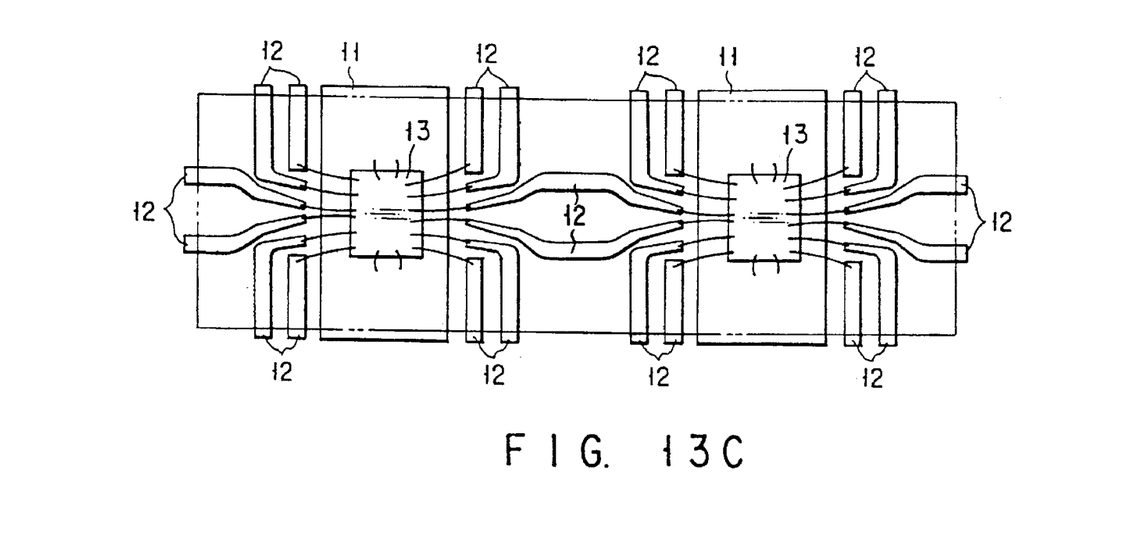
Figures 14, 15:
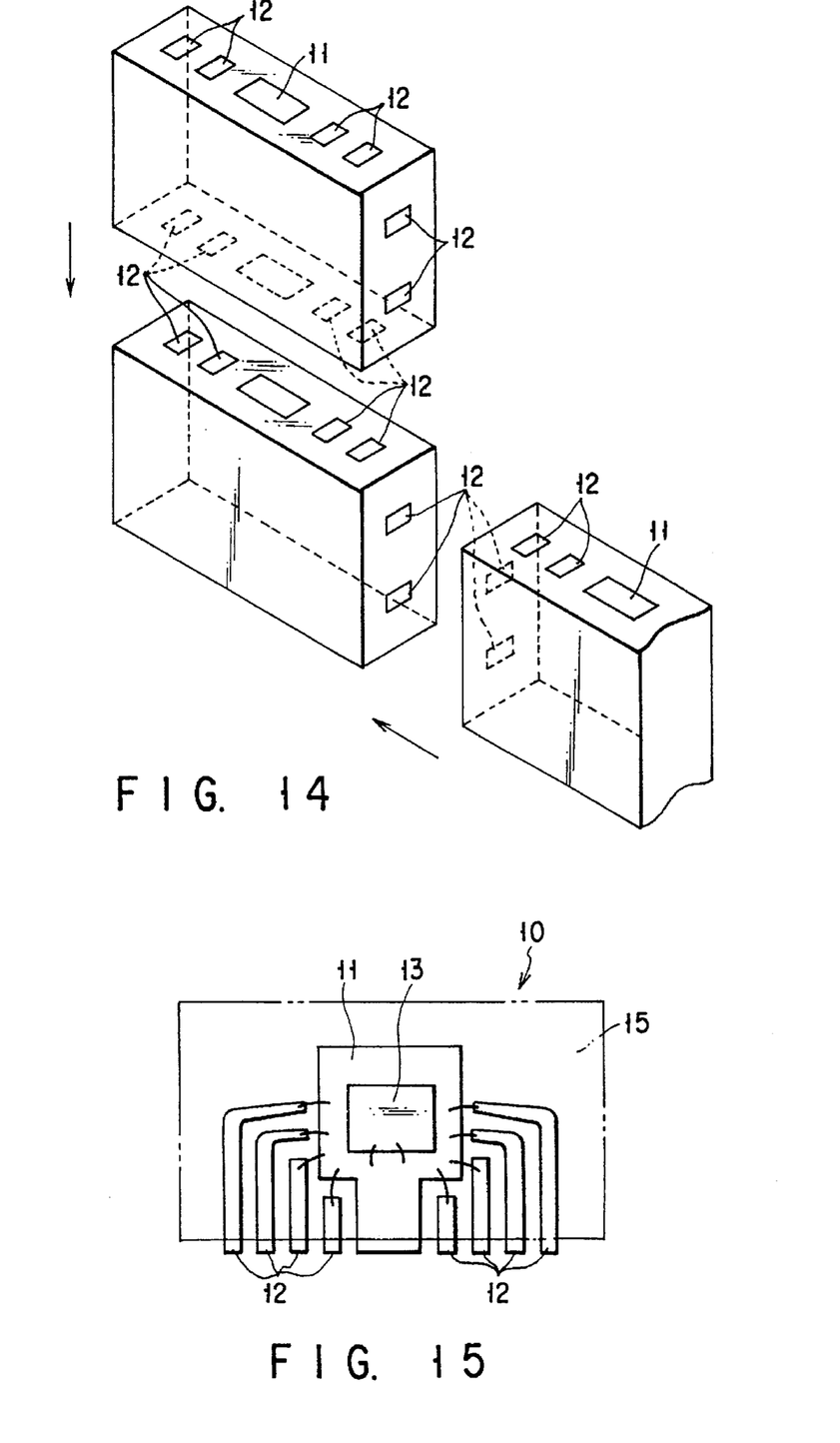
FIG. 14 is a plan view showing one example of connection of semiconductor devices of FIG. 13.
FIG. 15 is a cross-sectional view showing a semiconductor device according to another embodiment of the present invention.

In the case of the structure shown in FIG. 13C, a plurality of ground electrodes (leads) 11 with chips 13 mounted thereon may be integrally encapsulated with a resin to provide a semiconductor device. By so doing it is possible to obtain a semiconductor device with a plurality of input/output electrodes (signal leads) 12 initially connected together in a direction parallel to the surface of the circuit board.

Figure 16:
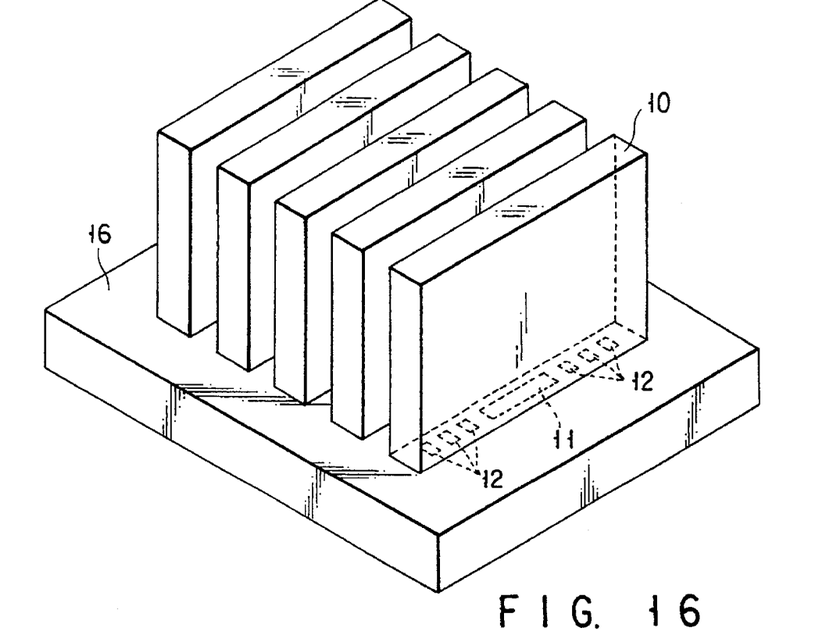
FIG. 16 is a perspective view showing a semiconductor apparatus according to another embodiment of the present invention.

The portions of those input/output electrodes (signal leads) 12 as shown in FIG. 15 can be so structured as to be brought out only from the bottom surface of the semiconductor device in which case the device is so preferably dimensioned as to have a very small depth, that is, in a direction vertical to a paper surface. Such a thin device can be arranged in the thickness direction in plural numbers as shown in FIG. 16, thus leading to an enhanced mounting density.

Figures 17, 18:
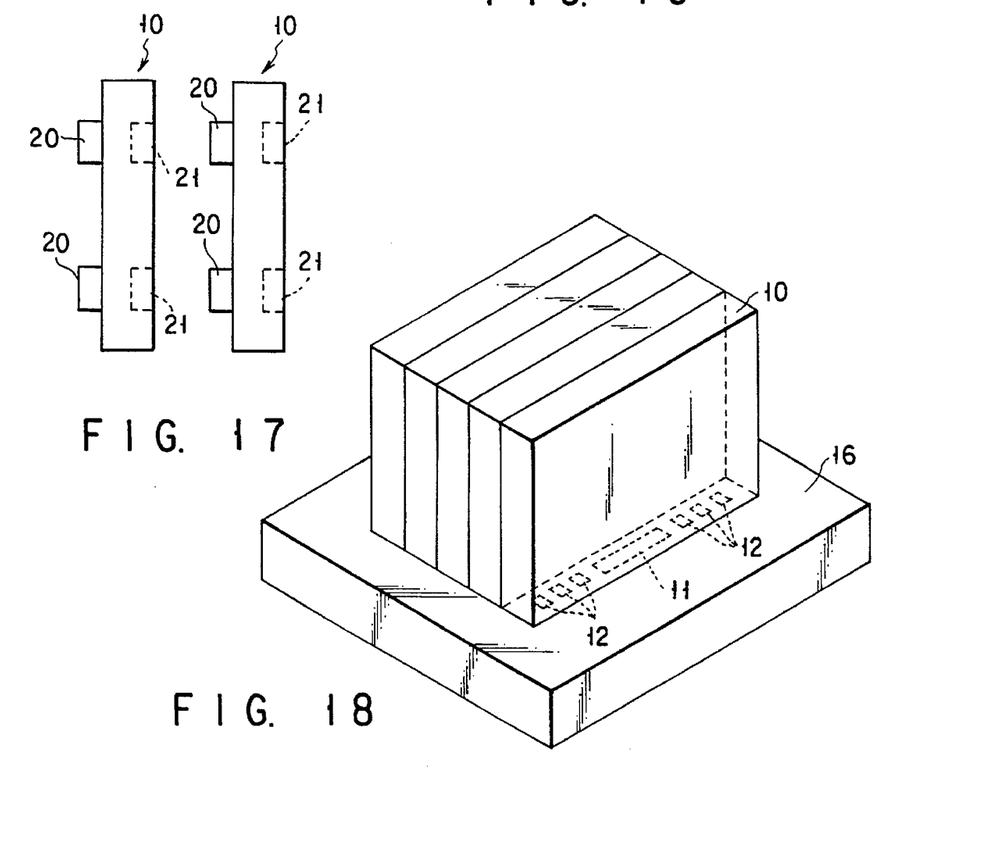
FIG. 17 is a cross-sectional view showing a semiconductor device according to another embodiment of the present invention.
FIG. 18 is a perspective view showing a semiconductor apparatus according to another embodiment of the present invention.
Figure 19:
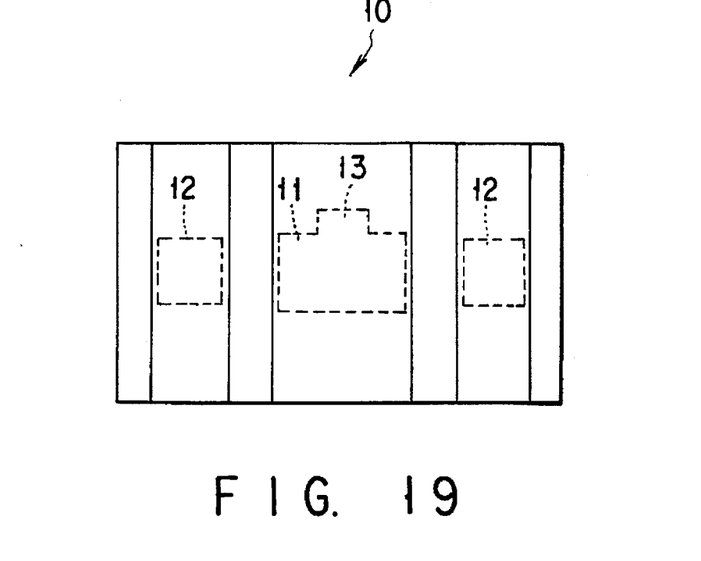
FIG. 19 is a plan view showing a semiconductor device according to another embodiment of the present invention.

A device whose structure is shown in FIG. 15 can be of such a type that fitting means 20 may be provided relative to fitting holes 21 in the thickness direction as shown in FIG. 17. Such a device, being provided in plural numbers, can readily construct a multi-chip package, as shown in FIG. 18, with the use of such fitting mechanisms. In this case, each device is face-contacted with an adjacent device, thus achieving a higher mounting density than the device shown in FIG. 16.

Figure 20:
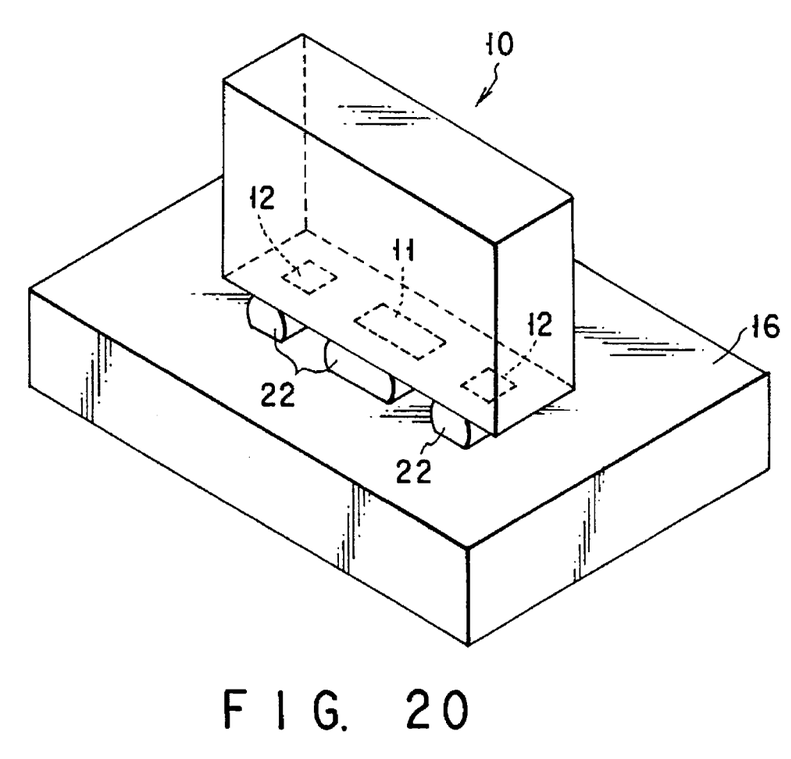
FIG. 20 is a perspective view showing a semiconductor apparatus according to another embodiment of the present invention.

The semiconductor device of the present invention enables the end face of the electrode (lead) which is exposed as a bottom face to be connected directly to an electrode surface (not shown) on the surface of the circuit board 16. If, in this case, the bottom surface of the device is so metallized as to cover the corresponding end faces of the electrodes (leads) 11 and 12, the area of metal portion contacting with the board is preferably increased upon being mounted on the board. The electrodes (leads) 11 and 12 of the device 10 may be connected to the corresponding electrode of the substrate 16 by metal bumps 22, such as solder bumps, as shown in FIG. 20.

The semiconductor device of the present invention is not restricted to the aforementioned embodiments. For example, the ground electrode (lead) may be recessed from the bottom surface of the device. In the semiconductor device 10 as shown in FIG. 7A, the input/output electrodes (signal leads) 12 may have their surfaces partially or wholly exposed in a major surface direction of a mounted semiconductor chip 13.

The semiconductor device of the present invention can be applied not only to a mold-type package with a chip, etc., encapsulated with a resin but also a ceramics type package.

Figure 21A:
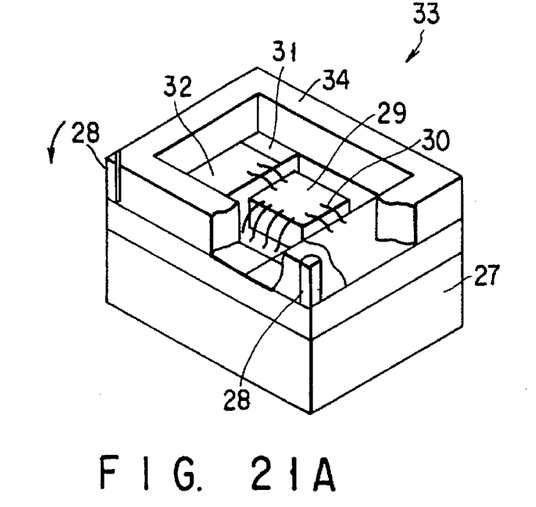
FIG. 21A is a perspective view showing a semiconductor device according to another embodiment of the present invention and FIG. 21B another view.
Figure 21B:
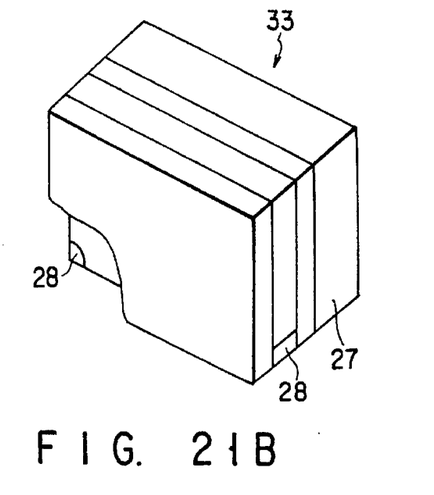

FIGS. 21A and 21B show one form of a ceramics type semiconductor device. FIG. 21A is a perspective view, partly cut away, showing a semiconductor structure in a pre-encapsulated state. In that structure, a semiconductor chip 29 is attached directly, by a resin-based adhesive or soldering, to a ground electrode 27 made of a metal and a ground electrode of the semiconductor chip 29 is connected by bonding wires to the ground electrode 27 of the device 33. An insulating substrate 31 and metal film 32 are sequentially formed over the ground electrode 27. A ceramics body 34 is formed, as a frame-like member, on the surface of the metal film 32 and one face of each of two electrodes (signal leads) 28 is situated in the same plane as that surface of the ceramics body which is attached to a board, the electrodes 28 serving as input/output electrodes (signal leads). The electrode 28 is connected to the metal film 32 and signal and power source terminals of the semiconductor chip 29 are connected to the metal film 32 by bonding wires 30. In this way, the signal and power source terminals of the semiconductor chip 29 are electrically connected by the metal film 32 to the electrodes (signal leads) 28. Although, in the embodiment shown in FIG. 21A, the electrodes (signal leads) 28 have been explained as being two in number, the number of the electrodes (leads) 28 is not restricted to that as set out above.

The semiconductor device 33 obtained as an encapsulated package is attached to the circuit board, not shown, in that arrangement shown in FIG. 21B, that is, electrically connected to the circuit board by soldering.

In the embodiment shown in FIG. 21B, the one-side faces of the ground electrode and input/output electrodes 28 are situated in the same plane as one surface of the semiconductor device, thus obtaining a compact unit. The semiconductor unit thus obtained has a greater advantage in view of its characteristics as well as its costs involved.

Figure 22A:
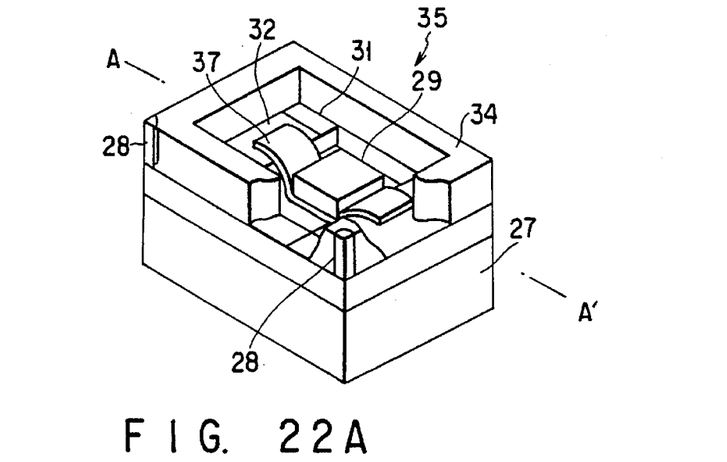
FIG. 22A is a perspective view showing a semiconductor device according to another embodiment of the present invention and FIG. 22B another view of FIG. 22A.
Figure 22B:
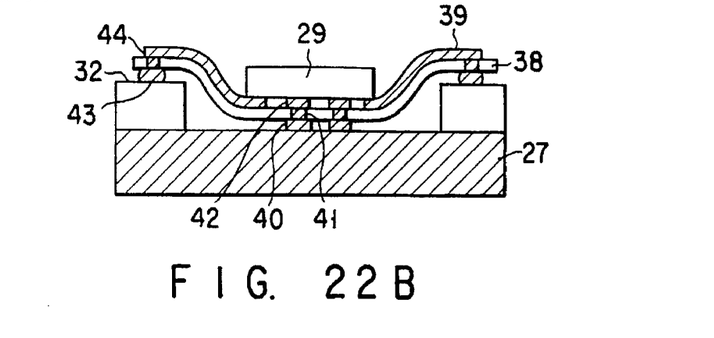

FIGS. 22A and 22B show an applied form of the aforementioned embodiment with its semiconductor chip connected with the use of a tape automated bonding TAB) technique.

FIG. 22A is a perspective view, partly taken away, showing a semiconductor device structure in a preencapsulated state and FIG. 22B is an enlarged, cross-sectional view, as taken along line A–A' in FIG. 22A. As shown in FIG. 22B, a ground electrode 27 is electrically connected to a semiconductor chip 29 through a bump 40, dielectric material embedded in a via hole 41 of an insulating film 38 and bump 42. The input/output terminals of the semiconductor chip 29 are connected to a metal film 39 and the metal film 39 is connected to a metal film 32 through a dielectric material embedded in a via hole 44 of the insulating film 39 and then through a bump 43. Further, the metal film 39 is connected to input/output electrodes 28.

The connection using the TAB technique is preferable from the standpoint of reducing an inductance involved. That is, the inductance of the bonding wire is about 0.8 nH per millimeter and, when grounding is made by four wires 0.5 mm in length, if the mutual inductance can be neglected, the inductance of the wire section becomes 0.1 nH. For the TAB connection, the inductance at this area is reduced to one half, or less, the non-TAB one, an aspect which is more preferable.

Although the present invention has been explained in conjunction with the aforementioned embodiments, it is not restricted thereto. For example, no restriction is made to the number of those electrodes provided in the semiconductor device of the present invention and more control terminals may be added to the semiconductor device. Further, the connection of the semiconductor chip using the TAB technique can be applied to the semiconductor device as set out in conjunction with the embodiments above.

As set out above, according to the present invention, it is possible to suppress the inductance grounded of the semiconductor device to a small extent and also to largely suppress a degradation in the gain of the semiconductor chip after a package has been obtained. Since, according to the present invention, the semiconductor device can be made compact, it is possible to achieve a high-reliable semiconductor device without decreasing a device-mount area on a circuit board.

According to the present invention, a high-reliable semiconductor device can be obtained as a high integration density unit on the circuit board with a reduced inductance.

Such a semiconductor device is extensively applied to an analog type that a source inductance exerts a direct influence over the electrical characteristic, such as a gain, and to a digital type that a logical operation error is induced due to an inductance resulting from a power source. Thus the semiconductor device of the present invention find a wider application due to its greater industrial value.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

a semiconductor chip, a sheet-like metal member electrically connected to the semiconductor chip and serving as a ground electrode for the chip, and input/output electrodes electrically connected to the semiconductor chip and situated in the same plane as that of the sheet-like metal member;

said chip, said sheet-like metal member, and said input/output electrodes being encapsulated in an electrically insulating member having a bottom surface and adapted to be mounted on a surface of a circuit board, wherein the sheet-like metal member is brought out from inside of the electrically insulating member without being bent and has first and second end faces, said first end face situated in substantially the same plane as the bottom surface of the electrically insulating member which faces to the surface of the circuit board when the device is mounted on the circuit board, and wherein the second end face of the sheet-like metal member is brought out from the electrically insulating member of a rectangular parallelepiped.

2. The semiconductor device according to claim 1, further comprising a shield metal sheet situated at a substantially right angle with respect to a chip mounting surface of the sheet-like metal member and put astride the electrically insulating member, the shield metal sheet extending from above the electrically insulating member to the bottom surface of the latter member.

3. The semiconductor device according to claim 1, wherein the end faces of the input/output electrodes are situated on that surface of the electrically insulating member in a 90°-intersecting relation to the end faces of the ground electrode.

4. The semiconductor device according to claim 1, wherein the first end face of the sheet-like metal member is projected 1 mm or less from the bottom surface of the electrically insulating member.

5. The semiconductor device according to claim 4, wherein the second end face of the sheet-like metal member is projected 1 mm or less from the bottom surface of the electrically insulating member.

6. A semiconductor apparatus comprising:

a semiconductor device including a semiconductor chip, a sheet-like metal member electrically connected to the semiconductor chip and serving as a ground electrode for the chip, input/output electrodes electrically connected to the semiconductor chip and situated in the same plane as that of the sheet-like metal member, and a circuit board having a face for mounting the semiconductor device thereon;

said chip, said sheet-like metal member, and said input/output electrodes being encapsulated with an electrically insulating member having a bottom surface, and wherein the sheet-like metal member in the semiconductor device is brought out from inside the electrically insulating member without being bent and has first and second end faces, said first end face situated in substantially the same plane as the bottom surface of the electrically insulating member and that surface of the electrically insulating member including the first end face of the metal member is so mounted as to face to the surface of the circuit board, and wherein the second end face of the sheet-like metal member is brought out from the electrically insulating member of rectangular parallelepiped.

7. The semiconductor apparatus according to claim 6, further comprising a shield metal sheet situated at a substantially right angle with a chip mounting surface of the sheet-like metal member and put astride the electrically insulating member, the shield metal sheet extending from above the electrically insulating member to the bottom surface of the latter member.

8. The semiconductor apparatus according to claim 6, wherein the end faces of the input/output electrodes are situated on that surface of the electrically insulating member in a 90°-intersecting relation to the end faces of the ground electrode.

9. The semiconductor apparatus according to claim 6, wherein the first end face of the sheet-like metal member if projected 1 mm or less from the bottom surface of the electrically insulating member.

10. The semiconductor apparatus according to claim 9, wherein the second end face of the sheet-like metal member is projected 1 mm or less from the bottom surface of the electrically insulating member.

* * * * *